(12) United States Patent
Jeong et al.

(10) Patent No.: US 7,843,741 B2
(45) Date of Patent: Nov. 30, 2010

(54) MEMORY DEVICES WITH SELECTIVE PRE-WRITE VERIFICATION AND METHODS OF OPERATION THEREOF

(75) Inventors: Hong-Sik Jeong, Gyeonggi-do (KR); Kwang-Jin Lee, Gyeonggi-do (KR); Dae-Won Ha, Seoul (KR); Gi-Tae Jeong, Seoul (KR); Jung-Hyuk Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 93 days.

(21) Appl. No.: 12/419,934

(22) Filed: Apr. 7, 2009

(65) Prior Publication Data

US 2009/0285008 A1    Nov. 19, 2009

(30) Foreign Application Priority Data

May 19, 2008 (KR) .................. 10-2008-0046134

(51) Int. Cl.
*G11C 7/10* (2006.01)
(52) U.S. Cl. ............. 365/189.04; 365/192; 365/185.22; 365/189.07; 365/236; 365/233.17
(58) Field of Classification Search ............ 365/189.04, 365/192, 185.22, 189.07, 236, 233.17
See application file for complete search history.

(56) References Cited

U.S. PATENT DOCUMENTS

| | | | | |
|---|---|---|---|---|
| 6,252,820 B1 * | 6/2001 | Nakamura | ............... | 365/233.1 |
| 6,913,969 B2 | 7/2005 | Yoo | | |

| | | | |
|---|---|---|---|
| 2006/0202263 A1 | 9/2006 | Lee | |
| 2007/0212880 A1 | 9/2007 | Park et al. | |
| 2007/0236987 A1 | 10/2007 | Cho et al. | |

FOREIGN PATENT DOCUMENTS

| | | |
|---|---|---|
| JP | 2003-124362 | 4/2003 |
| JP | 2004-048004 | 2/2004 |
| JP | 2005-108395 | 4/2005 |
| JP | 2005-268438 | 9/2005 |
| JP | 2007-180389 | 7/2007 |
| KR | 1020030094683 A | 12/2003 |
| KR | 1020040005331 A | 1/2004 |
| KR | 1020050014351 A | 2/2005 |
| KR | 1020050097595 A | 10/2005 |
| KR | 1020050108775 A | 11/2005 |
| KR | 1020060099690 A | 9/2006 |
| KR | 100706815 B1 | 4/2007 |
| KR | 1020070046348 A | 5/2007 |
| KR | 100764738 B1 | 10/2007 |

* cited by examiner

*Primary Examiner*—Thong Q Le
(74) *Attorney, Agent, or Firm*—Myers Bigel Sibley & Associates, P.A.

(57) ABSTRACT

A number of read cycles applied to a selected memory location of a memory device, such as a variable-resistance memory device, is monitored. Write data to be written to the selected memory location is received. Selective pre-write verifying and writing of the received write data to the selected memory location occurs based on the monitored number of read cycles. Selectively pre-write verifying and writing of the received write data may include, for example, writing received write data to the selected memory cell region without pre-write verification responsive to the monitored number of read cycles being greater than a predetermined number of read cycles.

20 Claims, 8 Drawing Sheets

MEMORY DEVICES WITH SELECTIVE PRE-WRITE VERIFICATION AND METHODS OF OPERATION THEREOF

CROSS-REFERENCE TO RELATE APPLICATIONS

This application claims priority under 35 U.S.C §119 to Korean Patent Application No. 10-2008-0046134, filed on May 19, 2008, in the Korean Intellectual Property Office, the entire contents of which are incorporated by reference.

BACKGROUND

1. Technical Field

The present invention relates to semiconductor memory devices and, more particularly, to memory devices and methods of operation thereof.

2. Description of Related Art

There is an increasing demand for semiconductor memory devices capable of random access, high integration and large capacity. Such semiconductor memory devices include flash memory devices, which are used, for example, in portable electronic devices. Semiconductor memory devices which substitute non-volatile material for capacitors in DRAM-like structures have also been introduced. Such devices include, for example, ferroelectric RAM (RFAM) devices that use ferroelectric capacitors, magnetic RAM (MRAM) devices that use a tunneling magneto-resistive (TMR) layer, and phase-change memory devices that use chalcogenide alloys. In particular, phase-change memory devices can be non-volatile and may be fabricated using relatively simple processes. For this reason, it is possible to realize a large capacity memory with a low cost.

A typical conventional phase change memory cell uses a material that may be electrically transitioned between different structured states having different electrical reading characteristics. For example, there are well known memory devices which are formed of chalcogenide material (hereinafter "GST material") that includes a compound of germanium, antimony and tellurium (GST). The GST material may be transitioned between an amorphous phase showing a relatively high resistivity and a crystalline phase showing a relatively low resistivity. Such a phase change memory cell may be programmed by annealing the GST material. Annealing temperature and duration may determine whether the GST material is left in an amorphous phase or a crystalline phase. A high resistivity state and a low resistivity state may represent programmed values '1' and '0', respectively, and may be detected by measuring the resistivity of the GST material.

In a typical phase change memory device, a memory cell comprises a resistive element and a switching element. FIG. 1 and FIG. 2 each illustrate memory cells of a phase change memory device. Referring to FIG. 1, a memory cell 10 of the phase change memory device includes a variable resistor 11, which is a resistive element, and an access transistor 12, which is a switching element. The variable resistor 11 is connected to a bit line BL. The access transistor 12 is connected between the variable resistor 11 and a ground. A word line WL is connected to a gate of the access transistor 12. The access transistor 12 is turned on when a predetermined voltage is supplied to the word line WL. When the access transistor 12 is turned on, the variable resistor 11 is supplied with a current Ic via the bit line BL.

FIG. 2 is another form of a memory cell 20 of a conventional phase change memory device. The memory cell 20 includes a variable resistor 21 and a diode 22 (a switching element). The diode 22 is turned on or turned off according to a voltage of the word line WL.

FIG. 3 is a diagram illustrating a write current for storing data in the above phase change memory device. Referring to FIG. 3, a pulse 30 of a reset current I_RST for writing reset data, and a pulse 40 of a set current I_SET for writing set data are illustrated.

A phase of the GST material (phase change material) of a memory cell may change according to an amplitude, duration or fall time of a current pulse supplied thereto. The phase of the phase change material corresponding to a set or a reset state may be determined by a volume of the amorphous phase material. Commonly, the amorphous phase corresponds to the reset state, and the crystalline phase corresponds to the set state. The volume of the amorphous phase material may decrease as the amorphous phase proceeds to the crystalline phase. The GST material typically has a resistance that varies according to the volume of the amorphous phase material formed. In other words, data to be written is determined according to the volume of amorphous phase of the GST material formed by different current pulses. A reset current I_RST may be supplied in order to form the above amorphous phase. A set current I_SET may be supplied in order to form the crystalline phase. Typically, a level of the reset current I_RST is greater than a level of the set current I_SET. However, a pulse width $\Delta T1$ of the reset current I_RST is typically relatively less than a pulse width $\Delta T2$ of the set current I_SET. The characteristic of the GST material determined by the write current supplied repeatedly changes according to a lapse.

One of issues that may be raised when realizing a phase change memory device is the endurance of the device. Endurance is the capability of maintaining normal function after repeated data writing and/or reading operations. The ability of endure a large number or writing and/or reading cycles is generally desired in order to support many applications, for example, random access memory applications, solid state disk/drive (SSD) applications and storage applications for mobile devices.

SUMMARY

Some embodiments of the present invention provide methods of operating memory devices. A number of read cycles applied to a selected memory location is monitored. Write data to be written to the selected memory location is received. Selective pre-write verifying and writing of the received write data to the selected memory location occurs based on the monitored number of read cycles. Selective pre-write verifying and writing of the received write data to the selected memory location based on the monitored number of read cycles may include, for example, writing received write data to the selected memory cell region without pre-write verification responsive to the monitored number of read cycles being greater than a predetermined number of read cycles.

In some embodiments, first write data to be written to the selected memory location is received and selectively pre-write verifying and writing the received write data to the selected memory location based on the monitored number of read cycles may include write verifying the first write data responsive to the monitored number of read cycles being less than the predetermined number and selectively writing or foregoing writing of the first write data to the selected memory location responsive to the write verification of the first write data. Second write data to be written to the selected memory location is received and selectively pre-write verifying and writing the received write data to the selected memory location based on the monitored number of read cycles may further include writing the second write data to the selected memory location without write verification for the second write data responsive to the monitored number of read cycles exceeding the predetermined number. Selectively pre-write verifying and writing the received write data to the selected memory location based on the monitored number of read cycles may include reading data stored in the selected memory location and comparing the read data and the received write data.

In some embodiments, monitoring a number of read cycles applied to a selected memory location includes monitoring a number of successive read operations occurring without writing to the selected memory location. A count of the read cycles may maintained, and may be initialized responsive to the count of the read cycles exceeding a predetermined count.

In further embodiments, a number of write cycles applied to the memory is monitored. Selective pre-write verifying and writing of the received write data to the selected memory location may be controlled based on the monitored number of write cycles. For example, selective pre-write verification may be enabled responsive to the number of write cycles exceeding a predetermined number.

Further embodiments of the present invention provide a memory device including a memory comprising a plurality of memory locations. The memory device further includes a control circuit configured to monitor a number of read cycles applied to a selected memory location of the plurality of memory locations and to selectively pre-write verify and write received write data to the selected memory location based on the monitored number of read cycles. The control circuit may be configured to enable and inhibit pre-write verification responsive to a pre-write verify enable signal. The control circuit may further include a write counter configured to count write cycles applied to the memory and to control the pre-write verify enable signal responsive to the count of write cycles. The control circuit may be configured to monitor a number of successive read operations occurring without writing to the selected memory location and to selectively pre-write verify and write received write data to the selected memory location based on the monitored number of successive read cycles. The control circuit may be configured to maintain a count of the read cycles, to selectively pre-write verify and write received write data to the selected memory location based on the count of read cycles and to initialize the count responsive to the count of the read cycles exceeding a predetermined count. A memory system may include such a memory device coupled to a memory controller.

In further embodiments, a memory device includes a memory cell array including a plurality of variable resistance memory cells. A control circuit is configured to monitor a number of read cycles applied to a selected memory cell of the plurality of memory cells and to write received write data in the selected memory cell in a first write mode or a second write mode based on the monitored number of read cycles. In the first write mode, the control circuit may selectively write data to the selected memory cell based on a comparison of the write data to data stored in the selected memory cell in the first mode. In the second write mode, the control circuit may write data to the selected memory cell without comparing the write data to data stored in the selected memory cell in the second mode.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF EMBODIMENTS

Embodiments of the present invention will now be described hereinafter with reference to the accompanying drawings. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "having," "having," "includes," "including" and/or variations thereof, when used in this specification, specify the presence of stated features, steps, operations, elements, and/or components, but do not preclude the presence or addition of one or more other features, steps, operations, elements, components, and/or groups thereof.

It will be understood that when an element is referred to as being "connected" or "coupled" to another element (or variations thereof), it can be directly connected or coupled to the other element or intervening elements may be present. In contrast, when an element is referred to as being "directly connected" or "directly coupled" to another element (or variations thereof), there are no intervening elements present.

It will be understood that, although the terms first, second, etc. may be used herein to describe various elements and/or components, these elements and/or components should not be limited by these terms. These terms are only used to distinguish one element and/or component from another element and/or component. Thus, a first element or component discussed below could be termed a second element or component without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
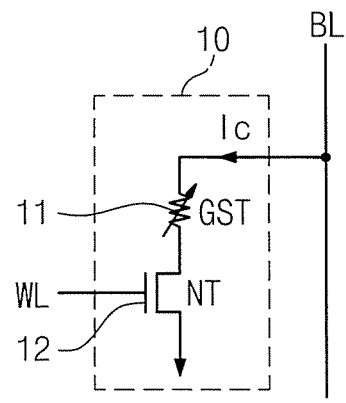
FIG. 1 is a circuit diagram illustrating a conventional phase change memory cell.
Figure 2:
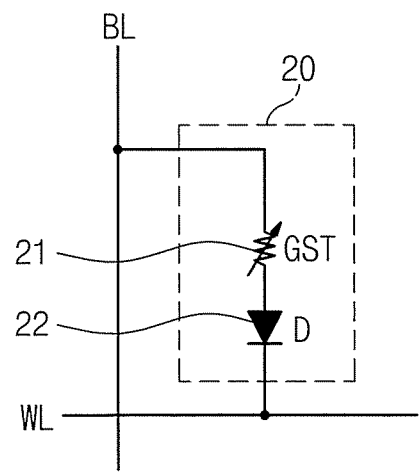
FIG. 2 is a circuit diagram illustrating another conventional phase change memory cell.
Figure 3:
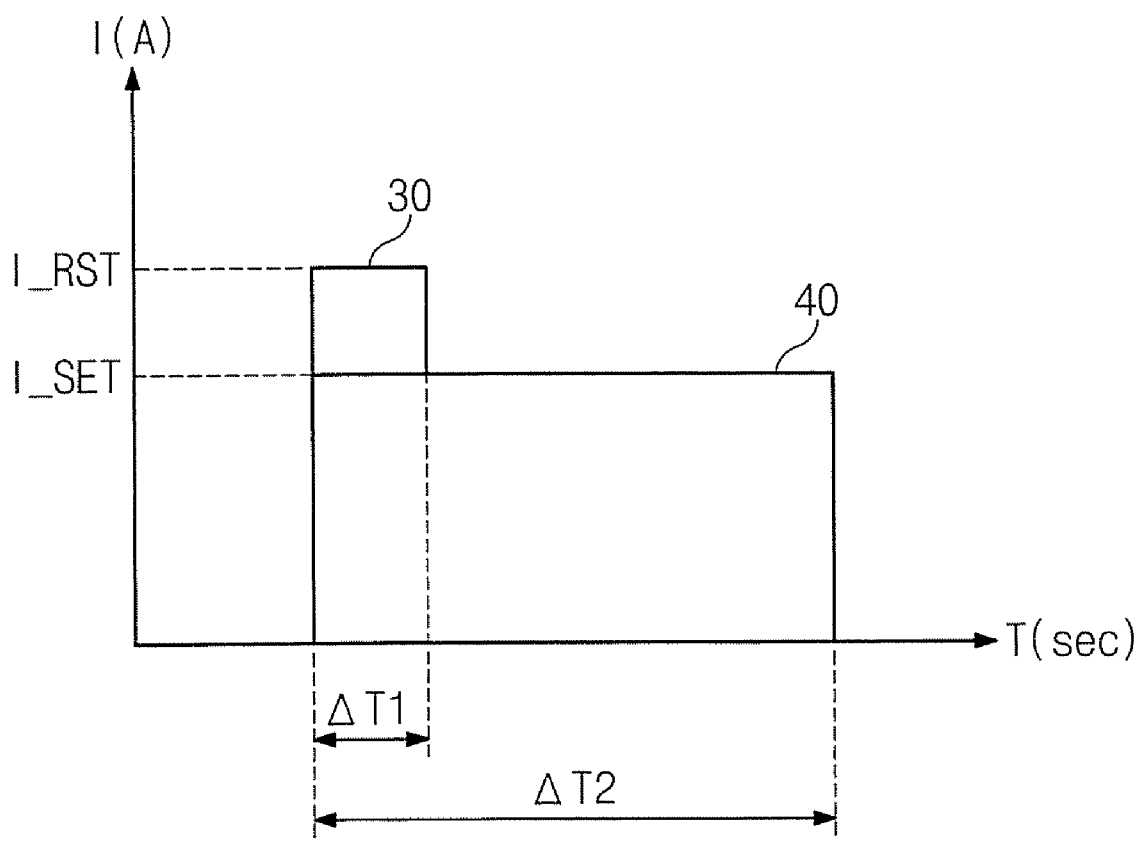
FIG. 3 illustrates write currents of a conventional phase change memory device.
Figure 4:
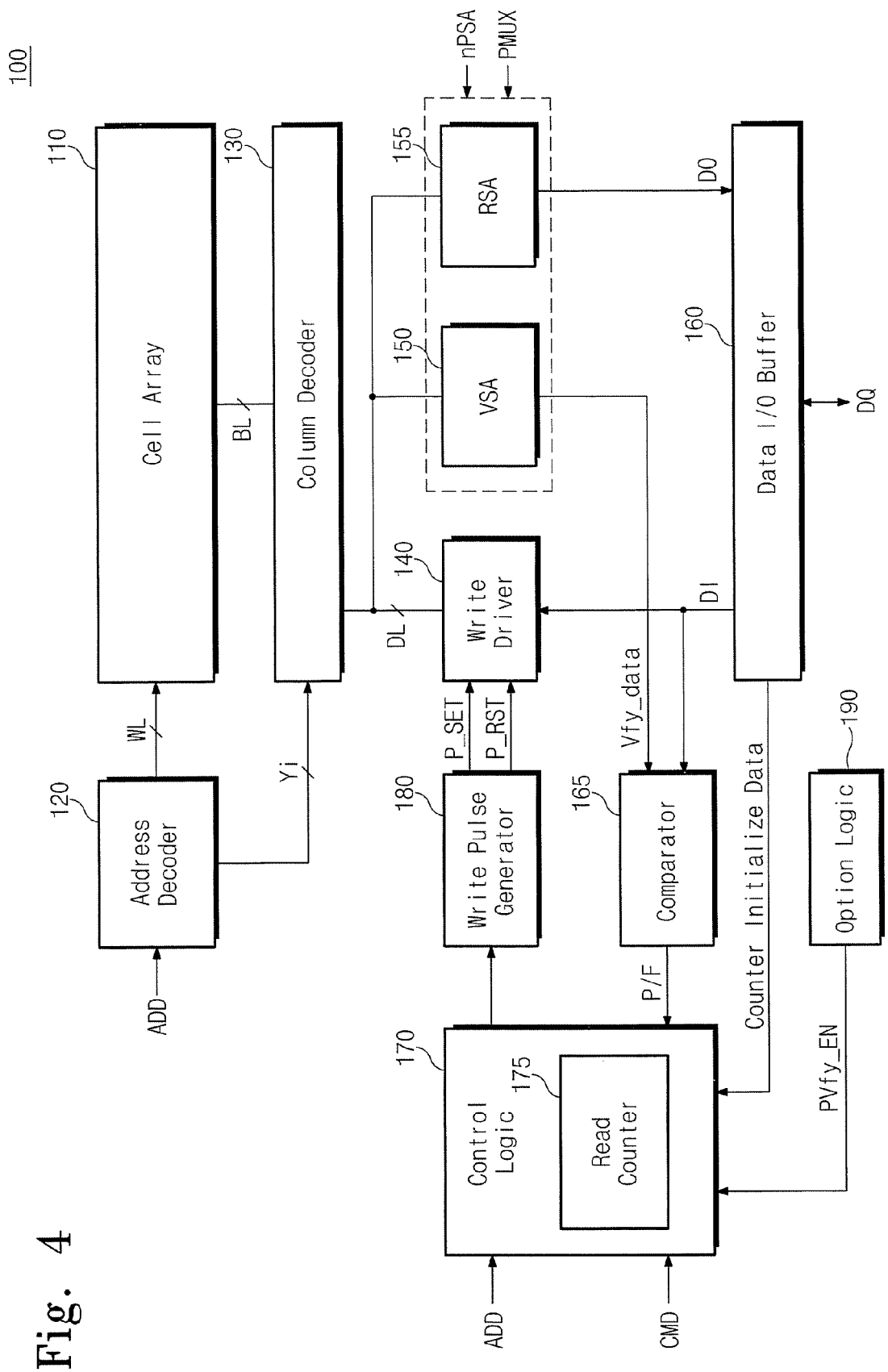
FIG. 4 is a block diagram illustrating a phase change memory device according to some embodiments of the present invention.

FIG. 4 is a block diagram of a phase change memory device 100 according to some embodiments of the present invention. Referring to FIG. 4, in the change memory device 100, a pre-write verify operation is activated or deactivated by an option logic circuit 190. The pre-write verify operation is a write verify operation which is performed for a selected memory cell before a write operation.

Upon activation of the pre-write verify operation, input write data DI to be stored in a selected memory cell and data already stored in the selected memory cell are compared so as to determine whether a write operation is to be actually performed. The phase change memory device 100 may solve problems that may occur in memory cells in which a write operation is continuously skipped according to the pre-write verify operation. Operations for enhancing read endurance and solving data retention are also activated simultaneously for the memory cells in which a read operation is repeatedly performed. For read endurance, when a number of read cycles is counted and the counted number of read cycles reaches a predetermined number, a control logic circuit 170 writes the input data to the selected memory cells without the pre-write verify operation. This will be described in further detail below.

A cell array 110 includes a plurality of memory cells arranged in rows (word lines) and columns (bit lines). Each memory cell includes a switching element and a resistor element. The switching element may be realized using various elements, such as a MOS transistor or diode. The resistor element may include a phase change layer made of a GST material.

An address decoder circuit 120 decodes an address input from an external source. The address may include a row address and a column address. The address decoder circuit 120 selects a word line WL responsive to the row address, and selects a bit line BL responsive to the column address. The address decoder circuit 120 provides column select signals Yi to a column decoder circuit 130.

The column decoder circuit 130 is connected to the memory cell array 110 via the bit lines BL, and is connected to a write driver circuit 140 via data lines DL. The column decoder circuit 130 electrically connects the data lines and the selected bit lines, in response to the column select signals Yi.

A write driver 140 supplies a write current for writing the write data in selected memory cells. The write driver 140 supplies a write current (I_SET or I_RST) via the data lines DL in response to a bias signal (not shown), a set pulse P_SET, and a reset pulse P_RST supplied from a write pulse generator circuit 180.

A first sense amplifier (marked by VSA in FIG. 4) 150 is controlled by the control logic circuit 170, and senses whether data written by a write driver circuit 140 is written normally. The first sense amplifier 150 senses and amplifies data of a selected memory cell in response to the control of the control logic circuit 170. The first sense amplifier 150 senses and latches data through bit line of the selected memory cell, in response to control signals nPSA and PMUX from the control logic 170. The latched and sensed data Vfy_data is supplied to a comparator circuit 165.

A second sense amplifier (marked by RSA in FIG. 4) 155 senses data written in the memory cell through the bit line selected by the column decoder circuit 130 during a read operation. The second sense amplifier 155 transfers the sensed data to a data input/output buffer circuit 160. Here, the first sense amplifier (VSA) 150 and the second sense amplifier (RSA) 155 are shown separately. However, a single sense amplifier may be used as both the first sense amplifier 150 and the second sense amplifier 155.

The data input/output buffer circuit 160 supplies externally provided input data DI to the write driver circuit 150 and the comparator circuit 165. Also, the data input/output buffer circuit 160 supplies the control logic circuit 170 with the count initializing data, which is stored in a predetermined area of the cell array 110, at power-on or an initialization operation of the phase change memory device 110.

The comparator circuit 165 compares the sensed verify data Vfy_data supplied from the first sense amplifier 150 and the input data DI supplied from the input/output buffer circuit 160. The comparator circuit 165 outputs a pass/fail signal P/F indicating whether the write data is written normally, according to comparison result of the verify data Vfy_data and the input data DI. If the verify data Vfy_data and the input data DI are detected to be identical, the comparator circuit 165 outputs a verify pass signal. If the verify data Vfy_data and the input data DI are detected not to be identical, then the comparator circuit 165 outputs a verify fail signal.

The control logic circuit 170 performs a pre-write verify operation or writes the input data DI to the selected memory cell without a pre-write verify operation, according to activation of the pre-write verify enable signal PVfy_EN. In the case the pre-write verify enable signal PVfy_EN is activated, the control logic circuit 170 performs a verify operation to a selected memory cell before a write operation of the input data is performed, during a write operation. The pre-write verify operation is an operation for determining whether the input write data DI is identical to data of the memory cell in which the write data DI is to be written. If the write data DI and the data of the selected memory cell are identical, a write operation of the write data DI is skipped. If the write data DI and the data of the selected memory cell are not identical, a write operation of the write data DI to the selected memory cell is performed. However, when the pre-write verify enable signal PVfy_EN is deactivated, the control logic circuit 170 writes the write data DI in the selected memory cell without a pre-write verify operation.

When the pre-write verify enable signal PVfy_EN is activated, the control logic circuit 170 performs an operation of managing the memory cells experiencing a read operation continuously without provision of a write current. In particular, a read counter 175 counts a number of read cycles RCNT of the selected memory cells. The read counter 175 counts the number of read cycles RCNT of a read operation of a particular memory cell which is performed continuously without a write operation, in accordance with a command CMD and an address ADD and/or the read counter 175 may count the number of read cycles RCNT of a particular block, in accordance with the command CMD and address ADD. When the number of read cycles RCNT counted in the read counter 175 reaches a predetermined number, the control logic circuit 170 controls a write pulse generator circuit 180 so as to write input data in the selected memory cell without a pre-write verify operation. The count of the number of read cycles RCNT in the read counter 175 is initialized after it reaches a predetermined number. To maintain the continuity of the number of read cycles RCNT even at power-off of the phase change memory device 100, the number of read cycles RCNT may be stored in the cell array 110 during power-off. The stored number of read cycles RCNT may be read again during power-on or an initialization operation of the phase change memory device 100, and supplied to the read counter 175 as the counter initializing data. Accordingly, the count of the number of read cycles RCNT may be continued even in cases such as when power is cut off in the phase change memory device 100.

The write pulse generator circuit 180 generates a set pulse P_SET or a reset pulse P_RST in accordance with control of the control logic circuit 170, and provides them to the write driver circuit 140. Here, the comparator circuit 165, control logic circuit 170 and write pulse generator circuit 180 may be called a control unit for performing the pre-write verify operation of the present invention.

An option logic circuit 190 supplies a pre-write verify enable signal PVfy_EN to the control logic circuit 170. The option logic circuit 190 enables activation or deactivation of the pre-write verify operation of the present invention. For example, the option logic circuit 190 may be realized as a mode register set (MRS) or a fuse option. In a phase change memory device where write function is considered more important than endurance, the option logic circuit 190 may be set so that the pre-write verify enable signal PVfy_EN is deactivated. However, when endurance is considered more important, the option logic circuit 190 may be set so that the pre-write verify enable signal PVfy_EN is activated, and as a result the pre-write verify operation is activated.

In case the pre-write verify enable signal PVfy_EN is activated, operation of the above described configuration may occur as follows. When write data DI is input after a write command, the control logic circuit 170 performs a verify read operation for identifying data of the selected memory cell. If the data detected by the verify read operation is identical to the write data DI, the control logic circuit 170 skips a substantial write operation for the write data DI. When the read command is input, the control logic circuit 170 activates the read counter 175 to count the number of read cycles for the selected memory cell or the selected memory block unit. The read counter 175 counts a number of read cycles for a predetermined memory block or a memory unit in which a write operation is skipped in accordance with the above-described pre-write verify operation. When the number of read cycles counted by the read counter 175 reaches the predetermined number, the control logic circuit 170 controls the write pulse generator circuit 180 and the first and second sense amplifiers 150 and 155 so that the input write data are written without performing a pre-write verify operation. Through the above described configuration, even when the pre-write verify enable signal PVfy_EN is activated, the phase change memory device 100 of the present invention may provide read endurance of memory cells experiencing repeated read operations. The problems associated with continuous read operations may be reduced, in accordance with the count operation for the number of read cycles of the memory cell region and its associated periodic write operation. A verify read operation by the first sense amplifier 150 is described as a method to identify data stored in the memory cell, but the present invention is not limited thereto. In other words, though not shown, data of the memory cell may be read by the second sense amplifier 155 and the read data supplied to the comparator circuit 165.

Figure 5:
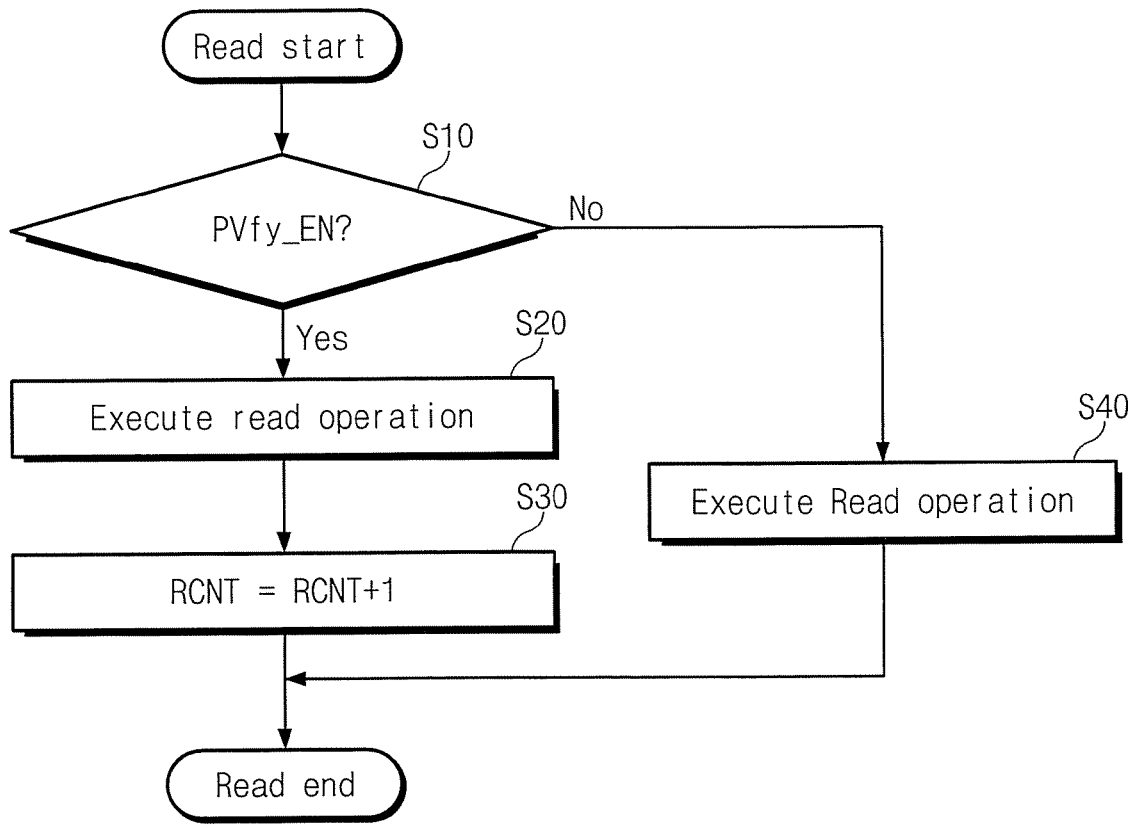
FIG. 5 is a flow chart of a read operation of the phase change memory device of FIG. 4.

FIG. 5 is a flow chart showing steps of a read operation of the phase change memory device 100 described with reference to FIG. 4. Referring to FIG. 5, the phase change memory device 100 reads data from a selected memory cell without counting of a number of read cycles or with counting of a number of read cycles, according to whether a pre-write verify enable signal PVfy_EN is activated In detail, upon input of the read command and address, a read operation for the selected memory cell is initiated. Before the read operation is performed, in step S10, the control logic circuit 170 detects whether the pre-write verify enable signal PVfy_EN is activated. If the pre-write verify enable signal PVfy_EN is not activated, in step S40, the control logic circuit 170 reads data of the selected memory cell without counting the number of read cycles RCNT. When the pre-write verify enable signal PVfy_EN is activated, in step S20, the control logic circuit 170 performs a read operation of data accompanying counting of a number of read cycles RCNT. In other words, the control logic circuit 170 performs a read operation for the selected memory location. Following the read operation, in step S30, the read counter 175 included in the control logic circuit 170 counts up the present number of read cycles RCNT. When the read operation and a number of read cycles counting operation are completed, the entire read operation for the selected memory location is ended. The number of read cycles RCNT counted for any of a variety of different units, for example, for a memory cell unit or for a memory location unit, such as a memory block.

Figure 6:
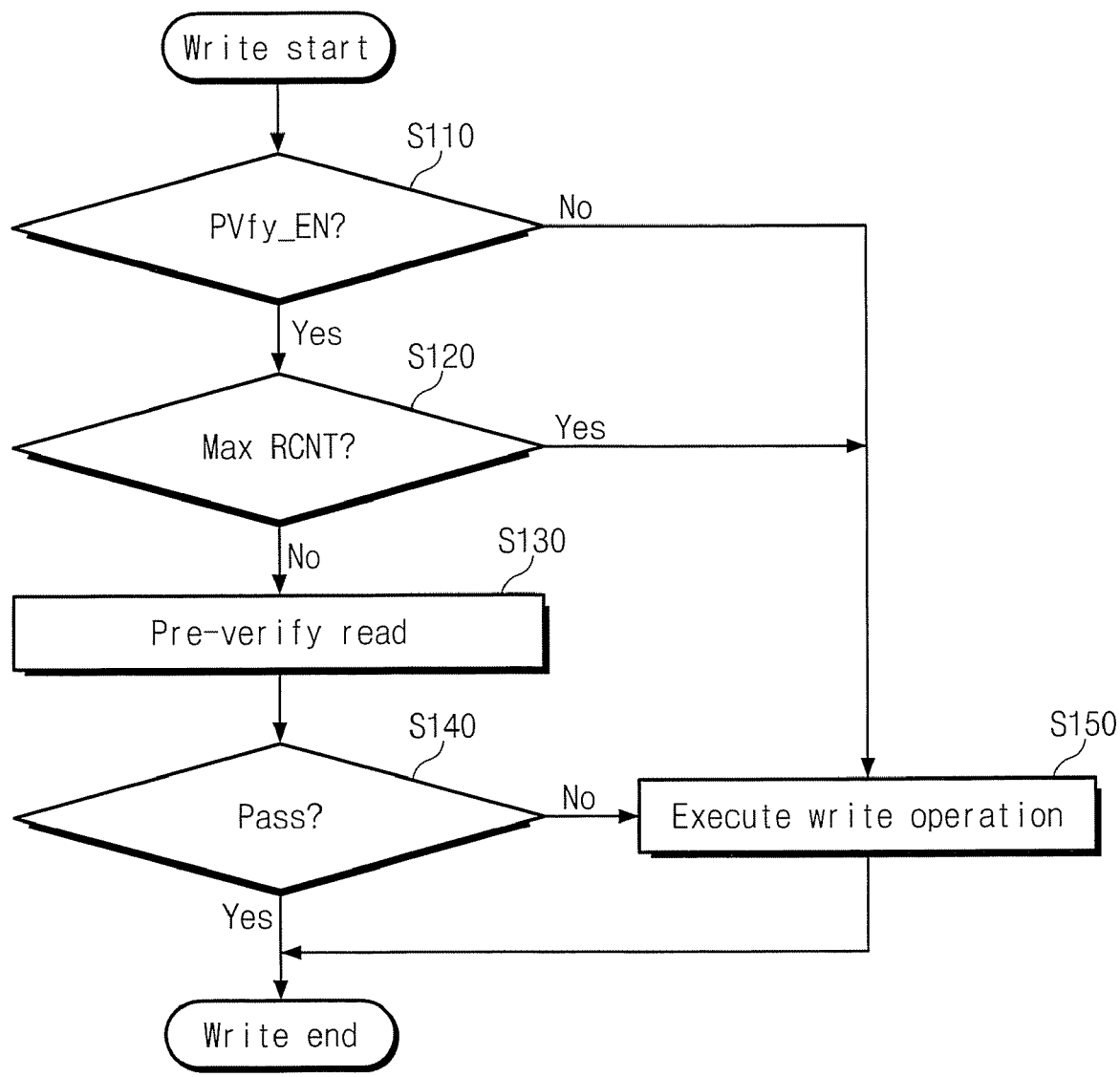
FIG. 6 is a flow chart of a write operation of the phase change memory device of FIG. 4.

FIG. 6 is a schematic block diagram of write operations of the phase change memory device 100 of FIG. 4. Referring to FIG. 6, when the pre-write verify enable signal PVfy_EN is activated, input data is written in the selected memory location without the pre-write verify operation when the number of read cycles RCNT reaches a predetermined number. Accordingly, read endurance of the memory cells experiencing repeated read operations may be enhanced.

When a write command, write data and an address are input, a write operation for the selected memory cell is initiated. Before the write operation is performed, in step S110, the control logic circuit 170 detects whether the pre-write verify enable signal PVfy_EN is activated. If the pre-write verify enable signal PVfy_EN is not activated, in step S150, the control logic circuit 170 performs the write operation without determining the number of read cycles and without a pre-write verify operation. However, when the pre-write verify enable signal PVfy_EN is activated, the control logic circuit 170 performs a pre-write verify read operation controlled by the number of read cycles RCNT. In other words, in step S120, the control logic circuit 170 detects whether the selected memory cell or cell region has reached a predetermined maximum count number. If the number of read cycles RCNT has reached the predetermined maximum count number, in step S150, the control logic circuit 170 performs a write operation for writing the write data DI in the selected memory cell region without a pre-write verify operation.

However, when the number of read cycles RCNT has not reached the maximum count number, a write operation accompanying a pre-write verify operation is conducted. In step S130, a verify read operation for the selected memory cells is performed. If the present data of the memory cell is detected to be identical to the write data to be written in the memory cell (i.e., in case of verify-pass) at step S140, no write of the data to the memory cell is performed. If the result of the pre-write verify operation is a failure at step S140, however, the write data DI is written into the selected memory cell region at step S150.

According to the illustrated write operations, even in case the pre-write verify enable signal PVfy_EN is activated, when the number of read cycles for memory cells reaches a predetermined number of read cycles, input data may be written without pre-write verification. Accordingly, it is possible to reduce further weakening of read endurance which may occur in a memory device using a pre-write verify method.

Figure 7:
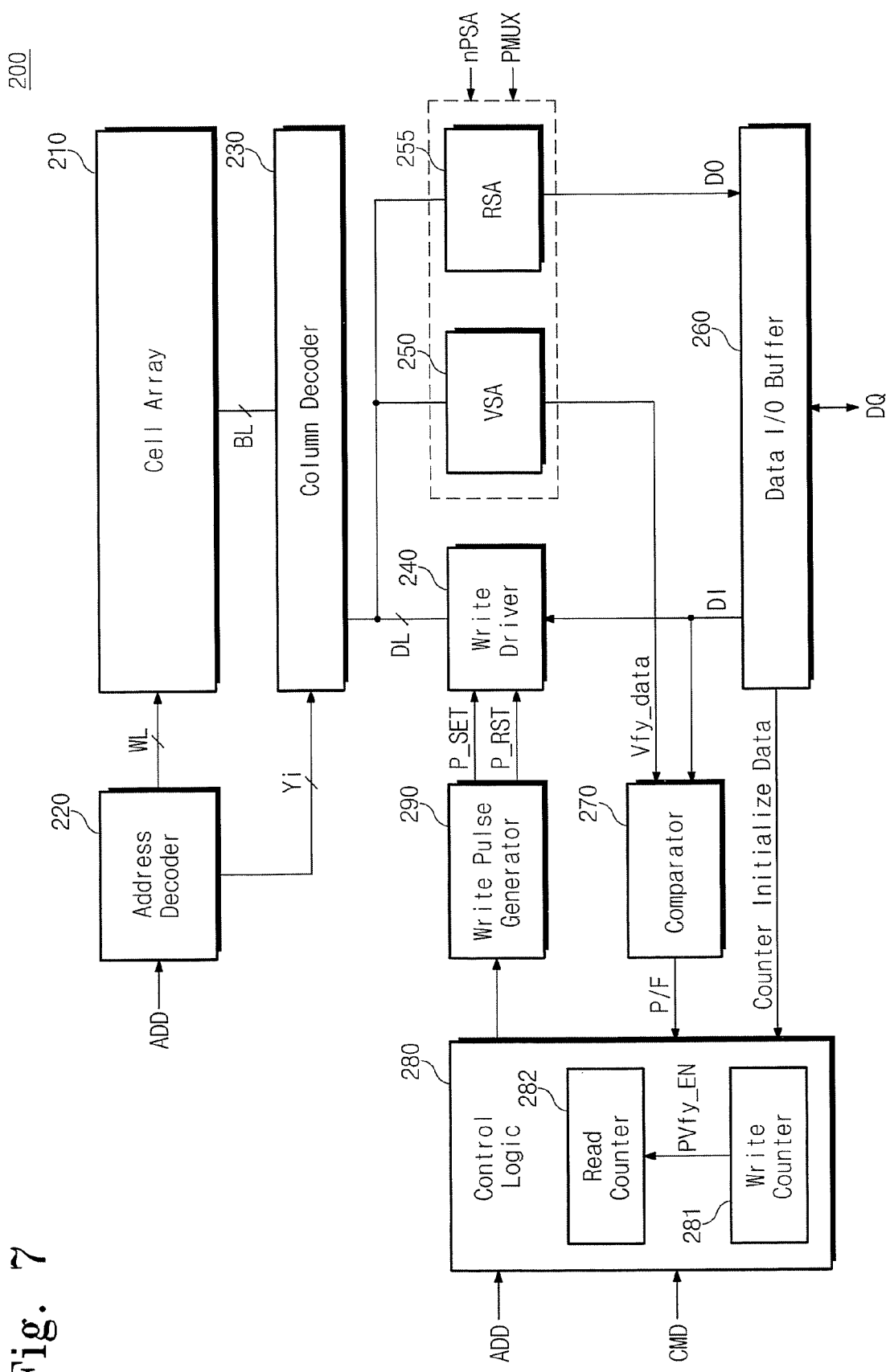
FIG. 7 is a block diagram of a phase change memory device according to further embodiments of the present invention.

FIG. 7 is a schematic block diagram illustrating a phase change memory device 200 according to further embodiments of the present invention. Referring to FIG. 7, in the phase change memory device 200, the pre-write verify enable signal PVfy_EN is activated after the number of write cycles reaches a predetermined number. Accordingly, durability of the phase change memory device may be extended by reducing endurance problems, such as set-stuck fail.

A cell array 210 comprises a plurality of memory cells arranged in rows (word lines) and columns (bit lines). The respective memory cells consist of a switching element and a resistor element. The switching element may be realized by using various devices, for example, MOS transistor or diode. The resistor element may include a phase change layer formed of a GST material described above.

An address decoder circuit 220 decodes an address input from an external source. The address may include a row address and a column address. The address decoder circuit 220 selects a word line WL responsive to the row address, and selects a bit line BL responsive to the column address. The address decoder circuit 220 provides column select signals Yi to a column decoder circuit 230.

The column decoder circuit 230 is connected to the memory cell array 210 via the bit lines BL, and is connected to a write driver circuit 240 via data lines DL. The column decoder circuit 230 electrically connects the data lines and the selected bit lines in response to the column select signals Yi.

A write driver circuit 240 supplies a write current for writing write data in a selected memory cell. The write driver circuit 240 supplies a write current (I_SET or I_RST) via the data lines DL in response to a bias signal (not shown), a set pulse (P_SET) and a reset pulse (P_RST) supplied from a write pulse generator circuit 290.

A first sense amplifier (VSA) 250 is controlled by a control logic circuit 270, and senses whether data written by a write driver circuit 240 is written normally. The first sense amplifier 250 senses and amplifies data of a selected memory cell in response to the control of the control logic circuit 280. The first sense amplifier 250 senses and latches data through a bit line of the selected memory cell in response to control signals nPSA and PMUX from the control logic circuit 280. The latched and sensed data Vfy_data is supplied to a comparator circuit 270.

A second sense amplifier (RSA) 255 senses data written in the memory cell through the bit line selected by the column decoder circuit 230 during a read operation. The second sense amplifier 255 transfers the sensed data to a data input/output buffer circuit 260. The first sense amplifier 250 and the second sense amplifier 255 are shown separately in FIG. 7, but other configurations may be used. The verify data Vfy_data is signal supplied to the comparator circuit 165 during a read operation by the second sense amplifier 255.

The data input/output buffer circuit 260 supplies externally provided input data DI to the write driver circuit 240 and the comparator circuit 270. In a power-on or initialization operation of the phase change memory device 200, the data input/output buffer circuit 260 may supply the count initializing data read from a predetermined area of the cell array 210 to the control logic circuit 280. The count initializing data is data for setting an initial count value of a write counter 281 and a read counter 282. The count values of the read and counters 281 and 282 may be stored in the cell array 210 or other a non-volatile storage region during a power-off operation.

The comparator circuit 270 compares sensed verify data Vfy_data supplied from the first sense amplifier 250 and input data DI supplied from the input/output buffer circuit 260. The comparator circuit 270 outputs a pass/fail signal P/F indicating whether write data is written normally, according to a comparison result of the verify data Vfy_data and the input data DI. If the verify data Vfy_data and the input data DI are detected to be identical, the comparator circuit 270 outputs the pass/fail signal P/F indicating a verify pass state. If the verify data Vfy_data and the input data DI are not identical, then the comparator circuit 270 outputs the pass/fail signal P/F indicating a verify fail state.

The control logic circuit 280 performs a pre-write verify operation or writes the input data DI to the selected memory cell without a pre-write verify operation depending on the state of the pre-write verify enable signal PVfy_EN. In case the pre-write verify enable signal PVfy_EN is activated, the control logic circuit 280 performs a verify operation to a selected memory cell before a write operation of the input data is performed. The pre-write verify operation involves determining whether the input write data DI is identical to data of the memory cell in which the write data DI is to be written. If the write data DI is identical to the data of the selected memory cell, a write operation of the write data DI is skipped. However, if the write data DI is not identical to the data of the selected memory cell, a write operation is conducted to write the write data DI to the selected memory cell. When the pre-write verify enable signal PVfy_EN is deactivated, the control logic circuit 280 writes the write data DI in the selected memory cell without a pre-write verify operation. The control logic circuit 280 of the present invention includes the write counter 281 for counting a number of write cycles WCNT of the memory cell region. The write counter 281 counts a number of write cycles SCNT of the memory cell region in accordance with a command CMD and an address ADD. When a number of write cycles WCNT reaches a predetermined number, the pre-write verify enable signal PVfy_EN is activated to also activate a pre-write verify mode where a detect operation is performed before a write operation is done.

When the pre-write verify enable signal PVfy_EN is activated, the control logic circuit 280 performs an operation of managing the memory cells experiencing continuous read operations without provision of a write current. In particular, a read counter 282 counts a number of read cycles RCNT of the selected memory cells. The read counter 282 counts the number of read cycles RCNT without a write operation of a particular memory cell, in accordance with the command CMD and address ADD or the read counter 282 may count the number of read cycles RCNT of a particular block, in accordance with the command CMD and address ADD. When the number of read cycles RCNT counted in the read counter 282 reaches a predetermined number, the control logic circuit 280 controls a write pulse generator circuit 290 so that input data is written in the selected memory cell without a pre-write verify operation. The read counter 282 is initialized after it reaches a predetermined number. The present count value of the non-volatile region is backed up during a power-off operation so that the number of write cycles WCNT or a number of read cycles RCNT may be maintained when power is cut off in the phase change memory device 200. During power-on, the number of write cycles WCNT or a number of read cycles RCNT may be supplied as count initializing data so that the count initializing value may be provided to the write counter 281 or the read counter 282.

The write pulse generator circuit 290 generates a set pulse P_SET or reset pulse P_RST according to control of the control logic circuit 280 and supplies them to the write driver circuit 240.

In the phase change memory device 200 having the above configuration may reduce the write endurance problem due to increase of a number of write cycles, and read endurance problem due to repeated read operations in the cell region without a write operation.

Figure 8:
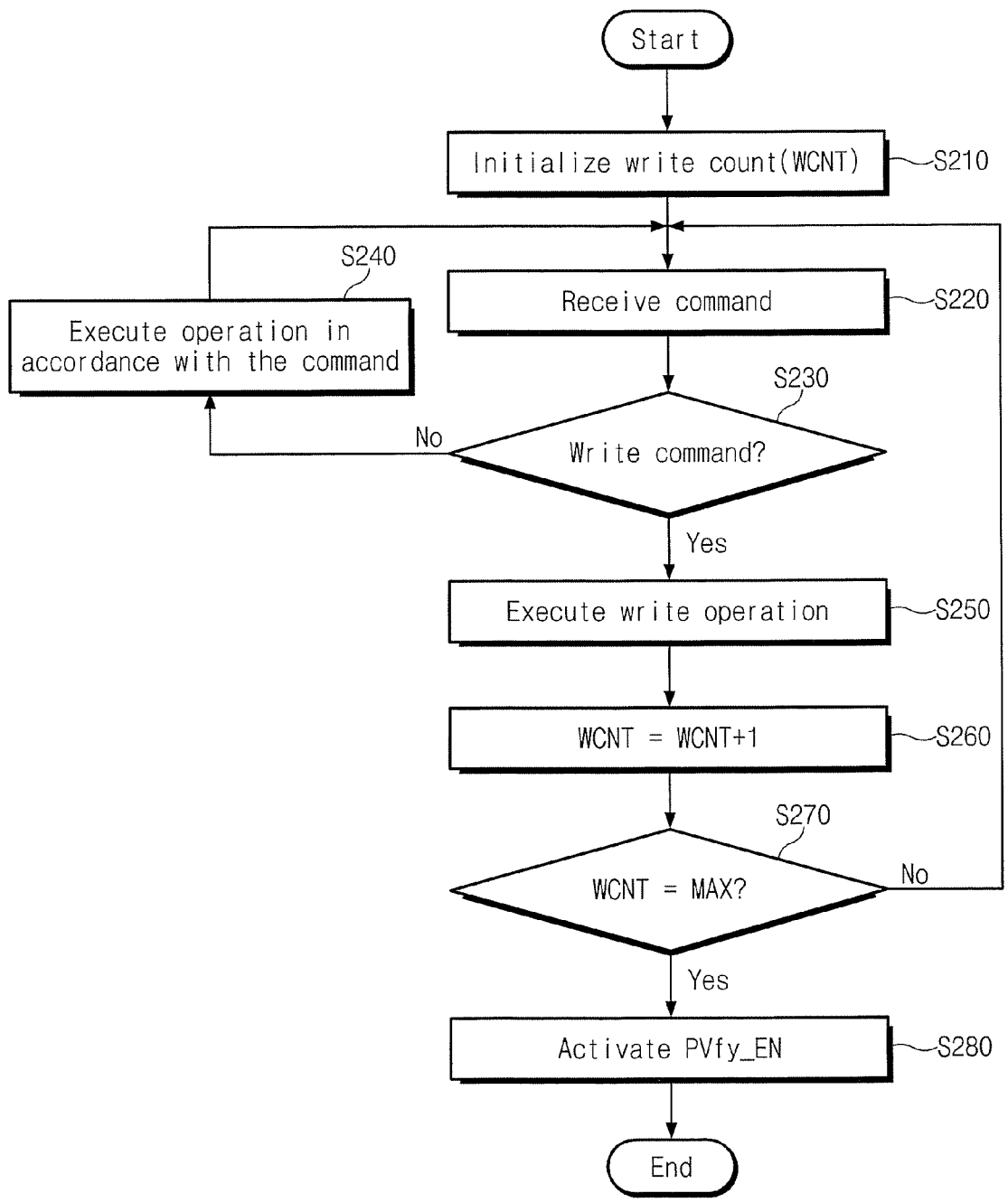
FIG. 8 is a schematic flow chart illustrating a write count operation of the phase change memory device of FIG. 7.

FIG. 8 is a flow chart illustrating briefly an operation of the control logic circuit 280 of FIG. 7. Referring to FIG. 8, the control logic circuit 280 counts a data number of write cycles of the cell array 210. When the counted number of write cycles reaches a predetermined count number, a pre-write verify operation is activated. Accordingly, the control logic circuit 280 supports a high-speed write operation during a normal operation. But when the pre-write verify enable signal PVfy_EN is activated, the number of write cycles is minimized and is switched into a mode of operation to increase endurance of the phase change memory device 200.

When power is supplied to the phase change memory device 200, the phase change memory device 200 initializes the write count value WCNT at step S210. For example, the write count value WCNT may be initialized to "0" in the initial power-on operation in a mounted condition of the phase change memory device 200. However, as a repeated number of write cycles has to be accumulated in mounted condition, the write count value has to be accumulated after the initial power-on. Therefore, when power is cut off from the phase change memory device 200, the write count number until the power was cut off is stored in a non-volatile memory location. During a power-on operation, initialization of the write count value WCNT is done by reading the write count number stored in the non-volatile memory location and inputting this in the write counter 281. Afterwards, the control logic circuit 280 receives a command at step S220, then monitors whether the input command is a write command. If the supplied command is not a write command, the control logic circuit 280 performs an operation corresponding to the input command at step S240, then returns to wait for the next input command. However, if the input command is a write command, the control logic circuit 280 performs a write operation for the selected memory cell or the memory cell region at step S250. The write counter 281 (refer to FIG. 7) counts up the write count WCNT after the write operation is completed at step S260. The control logic circuit 280 determines whether the write count WCNT has reached the predetermined maximum value at step S270. If the write count WCNT has not reached the maximum value MAX, the procedure moves to the step of awaiting the next command. If the write count WCNT reaches the maximum value MAX, the write counter 281 activates the pre-write verify enable signal PVfy_EN at step S280. A verify operation is performed before data is input, and a protection operation for the memory cells experiencing repeated read operations is activated by the read counter 282 (refer to FIG. 7). The comparator circuit 270, the control logic circuit 280 and the write pulse generator circuit 290 are parts of a control circuit that performs the pre-write verify operation. After a counted number of write cycles reaches the maximum number of write cycles, the endurance of the phase change memory device of the present invention may be improved through activating the pre-write verify enable signal PVfy_EN.

Figure 9:
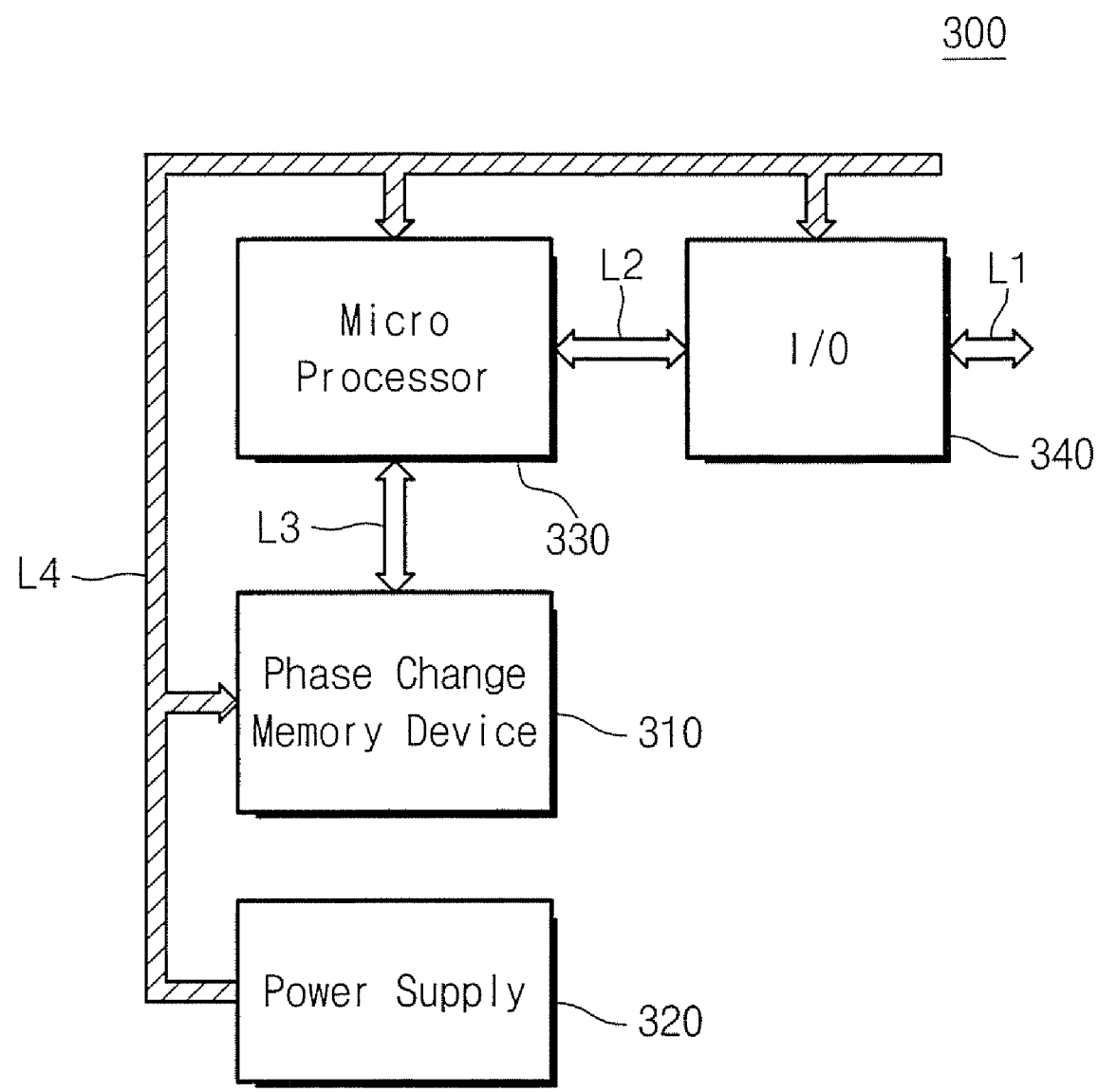
FIG. 9 is a schematic block diagram illustrating a portable electronic system including a phase change memory device according to some embodiments of the present invention.

FIG. 9 is a block diagram illustrating an exemplary application of a phase change memory device according to some embodiments of the present invention. The system 300 of FIG. 9, for example, a portable electronic device, includes a phase change memory device 310, which may be, for example, a memory card or SSD. The phase change memory device 310 may be, for example, a working memory in a system such as a laptop computer or notebook computer.

The phase change memory device 310 may be connected to a microprocessor 330 via a bus line L3 to serve as a main memory of the system 300. A power supply 320 supplies power to the microprocessor 330, an input/output device 340, and the phase change memory device 310 via a power line L4. The microprocessor 330 and the input/output device 340 may, for example, serve as a memory controller for controlling the phase change memory device 310.

Input data is supplied to the input/output device 340, and the microprocessor 330 receives and processes the input data via a line L2. Input or processed data is supplied to the phase change memory device 310 via a bus line L3. The phase change memory device 310 stores data supplied via the bus line L3. Also, data stored in the memory cell may be read by the microprocessor 330 and output externally via the input/output device 340.

Even when the power supplier 320 is not supplying power to the power line L4, the data stored in memory cell of the phase change memory device 310 is not erased due to the non-volatile characteristic of the phase change material. The phase change memory device 310 may have a faster operation speed and consume less electricity than other types of memory devices.

As the portable electronic system 300 includes a variable resistance memory device with improved write endurance and read endurance, it may provide storage with high reliability. Particularly, the phase change memory device 310 may be particular advantageous for use as a solid state disk (SSD). In this case, the input/output device 340 may be configured so that it can communicate with an external device (e.g. host) via one of the various interface protocols, for example, USB, MMC, PCI-E, SATA, PATA, SCSI, ESDI and IDE.

A variable resistance memory device is a non-volatile memory device capable of maintaining stored data even when power is cut off. The variable resistance memory device may be widely used for code storage as well as for data storage, for example, in mobile devices such as cellular phones, PDAs, digital cameras, portable game consoles, and MP3 players. Variable resistance memory device may also be used in other applications, for example, in HDTVs, DVD players, routers, and GPS devices.

Variable resistance memory devices and/or memory controllers according to some embodiments of the present invention may be packaged in various different ways. Examples of packages that may be used include: package on package (PoP), ball grid arrays (BGAs), chip scale packages (CSPs), Plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), multi-chip package (MCP), wafer-level fabricated package (WFP), wafer-level processed stack package (WSP).

Although the present invention has been described in connection with the embodiments of the present invention illustrated in the accompanying drawings, it is not limited thereto. Persons with skill in the art will recognize that embodiments of the present invention may be applied to other types of memory devices. The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of operating a memory device, the method comprising:
   monitoring a number of read cycles applied to a selected memory location;
   receiving write data to be written to the selected memory location; and
   selectively pre-write verifying and writing the received write data to the selected memory location based on the monitored number of read cycles.

2. The method of claim 1, wherein selectively pre-write verifying and writing the received write data to the selected memory location based on the monitored number of read cycles comprises writing received write data to the selected memory cell region without pre-write verification responsive to the monitored number of read cycles being greater than a predetermined number of read cycles.

3. The method of claim 2:
   wherein receiving write data comprises receiving first write data to be written to the selected memory location;
   wherein selectively pre-write verifying and writing the received write data to the selected memory location based on the monitored number of read cycles comprises:
      write verifying the first write data responsive to the monitored number of read cycles being less than the predetermined number; and selectively writing or foregoing writing of the first write data to the selected memory location responsive to the write verification of the first write data;
   wherein receiving write data further comprises receiving second write data to be written to the selected memory location; and
   wherein selectively pre-write verifying and writing the received write data to the selected memory location based on the monitored number of read cycles further comprises writing the second write data to the selected memory location without write verification for the second write data responsive to the monitored number of read cycles exceeding the predetermined number.

4. The method of claim 1, wherein selectively pre-write verifying and writing the received write data to the selected memory location based on the monitored number of read cycles comprises:
   reading data stored in the selected memory location; and
   comparing the read data and the received write data.

5. The method of claim 1, wherein monitoring a number of read cycles applied to a selected memory location comprises monitoring a number of successive read operations occurring without writing to the selected memory location.

6. The method of claim 1, wherein monitoring a number of read cycles applied to a selected memory location comprises maintaining a count of the read cycles and initializing the count responsive to the count of the read cycles exceeding a predetermined count.

7. The method of claim 1, further comprising monitoring a number of write cycles applied to the memory and to control selectively pre-write verifying and writing the received write data to the selected memory location based on the monitored number of write cycles.

8. A memory device comprising:
   a memory comprising a plurality of memory locations; and
   a control circuit configured to monitor a number of read cycles applied to a selected memory location of the plurality of memory locations and to selectively pre-write verify and write received write data to the selected memory location based on the monitored number of read cycles.

9. The memory device of claim 8, wherein the control circuit is configured to enable and inhibit pre-write verification responsive to a pre-write verify enable signal.

10. The memory device of claim 9, wherein the control circuit comprises a write counter configured to count write cycles applied to the memory and to control the pre-write verify enable signal responsive to the count of write cycles.

11. The memory device of claim 8, wherein the control circuit is configured to monitor a number of successive read operations occurring without writing to the selected memory location and to selectively pre-write verify and write received write data to the selected memory location based on the monitored number of successive read cycles.

12. The memory device of claim 8, wherein the control circuit is configured to maintain a count of the read cycles, to selectively pre-write verify and write received write data to the selected memory location based on the count of read cycles and to initialize the count responsive to the count of the read cycles exceeding a predetermined count.

13. A memory system comprising the memory device of claim 8 coupled to a memory controller.

14. A memory device comprising:
   a memory cell array including a plurality of variable resistance memory cells; and
   a control circuit configured to monitor a number of read cycles applied to a selected memory cell of the plurality of memory cells and to write received write data in the selected memory cell in a first write mode or a second write mode based on the monitored number of read cycles.

15. The memory device of claim 14, wherein, in the first write mode, the control circuit selectively writes data to the selected memory cell based on a comparison of the write data to data stored in the selected memory cell in the first mode.

16. The memory device of claim 14, wherein, in the second write mode, the control circuit writes data to the selected memory cell without comparing the write data to data stored in the selected memory cell in the second mode.

17. The memory device of claim 14, wherein the control circuit is configured to monitor a number of successive read cycles applied to the selected memory cell without a write operation and to selectively write received write data in the selected memory cell in a first write mode or a second write mode based on the monitored number of successive read cycles without a write operation.

18. The memory device of claim 14, wherein the control circuit is configured to transition between the first write mode and the second write mode responsive to a pre-write verify enable signal.

19. The memory device of claim 14, wherein the control circuit is further configured to monitor a number of write cycles applied to the memory cell array and to transition between the first and second modes responsive to the monitored number of write cycles.

20. A memory system comprising the memory device of claim 14 coupled to a memory controller.

* * * * *